US010269681B2

United States Patent
Kikugawa (10) Patent No.: US 10,269,681 B2
(45) Date of Patent: Apr. 23, 2019

(54) SEMICONDUCTOR DEVICE AND MANUFACTURING METHOD OF SEMICONDUCTOR DEVICE

(71) Applicant: Mitsubishi Electric Corporation, Tokyo (JP)

(72) Inventor: Satoru Kikugawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/547,599

(22) PCT Filed: Apr. 8, 2015

(86) PCT No.: PCT/JP2015/061041
§ 371 (c)(1),
(2) Date: Jul. 31, 2017

(87) PCT Pub. No.: WO2016/162991
PCT Pub. Date: Oct. 13, 2016

(65) Prior Publication Data
US 2018/0019186 A1 Jan. 18, 2018

(51) Int. Cl.
*H01L 23/40* (2006.01)
*H01L 23/367* (2006.01)
*H01L 21/48* (2006.01)

(52) U.S. Cl.
CPC ...... *H01L 23/4006* (2013.01); *H01L 21/4882* (2013.01); *H01L 23/367* (2013.01);
(Continued)

(58) Field of Classification Search
CPC .... H01L 23/4006–2023/4087; H01L 21/4882; H01L 2023/4037–2023/4068
See application file for complete search history.

(56) References Cited

U.S. PATENT DOCUMENTS 4,712,159 A 12/1987 Clemens
5,659,458 A * 8/1997 Patchen .............. H01L 23/3677
257/678

(Continued)

FOREIGN PATENT DOCUMENTS

JP S59-177955 U 11/1984
JP S62-244154 A 10/1987
(Continued)

OTHER PUBLICATIONS

International Search Report of the International Searching Authority dated Jun. 23, 2015 for the corresponding international application No. PCT/JP2015/061041 (and English translation).

(Continued)

*Primary Examiner* — Jose R Diaz
(74) *Attorney, Agent, or Firm* — Posz Law Group, PLC (57) ABSTRACT

A semiconductor device includes: a wiring board including an insulating board and a wiring layer, the insulating board having an element mounting surface, which is a first main surface, and a back surface, which is a second main surface on the opposite side of the element mounting surface, the wiring layer being formed on the back surface and including a wiring portion and a heat dissipation portion; a power element that is a semiconductor element, is mounted on the element mounting surface of the wiring board, and is connected to the wiring portion; a spacer that is interposed between the power element and the element mounting surface of the wiring board and is connected to the back-surface-side heat dissipation portion; and a heatsink that sandwiches, together with the spacer, the power element and is secured to the spacer.

9 Claims, 6 Drawing Sheets

(52) U.S. Cl.
CPC ............... *H01L 2023/4031* (2013.01); *H01L 2023/4056* (2013.01); *H01L 2023/4087* (2013.01)

(56) References Cited

U.S. PATENT DOCUMENTS

| | | | | |
|---|---|---|---|---|
| 7,206,204 B2* | 4/2007 | Nakatsu | ............... | H01L 23/4006 165/80.3 |
| 7,746,648 B2* | 6/2010 | Yamada | ............... | H01L 23/34 165/185 |
| 9,196,564 B2* | 11/2015 | Gektin | ............... | H01L 23/4006 |
| 2006/0114657 A1* | 6/2006 | Refai-Ahmed | ............... | G06F 1/20 361/719 |
| 2007/0285888 A1* | 12/2007 | Kearns | ............... | G01B 21/20 361/679.54 |
| 2010/0315787 A1 | 12/2010 | Li et al. | | |
| 2013/0016477 A1* | 1/2013 | Yokoya | ............... | H01L 23/36 361/719 |
| 2013/0314877 A1* | 11/2013 | Watanabe | ............... | H01L 23/34 361/719 |
| 2017/0034951 A1* | 2/2017 | Wang | ............... | G02B 6/4269 |
| 2018/0019186 A1* | 1/2018 | Kikugawa | ............... | H01L 23/4006 |

FOREIGN PATENT DOCUMENTS

| | | |
|---|---|---|
| JP | H06-260573 A | 9/1994 |
| JP | 3021071 U | 11/1995 |
| JP | H08-153837 A | 6/1996 |
| JP | 2000-114674 A | 4/2000 |
| JP | 2004-022591 A | 1/2004 |
| JP | 2004-095697 A | 3/2004 |
| JP | 2006-135169 | 5/2006 |
| JP | 2008-098556 A | 4/2008 |
| JP | 2011-199044 A | 10/2011 |

OTHER PUBLICATIONS

Extended European Search Report dated Dec. 6, 2016 issued in corresponding EP patent application No. 15862153.2.
Office action dated Jan. 26, 2018 issued in corresponding CN patent application No. 201610212900.1 (and English machine translation thereof).
Office Action dated Nov. 14, 2017 issued in corresponding JP patent application No. 2017-511409 (and English machine translation attached).
Office Action dated Aug. 27, 2018 issued in corresponding CN patent application No. 201610212900.1 (and English translation).

* cited by examiner

SEMICONDUCTOR DEVICE AND MANUFACTURING METHOD OF SEMICONDUCTOR DEVICE

CROSS REFERENCE TO RELATED APPLICATION

This application is a U.S. national stage application of International Patent Application No. PCT/JP2015/061041 filed on Apr. 8, 2015, the disclosure of which is incorporated herein by reference.

TECHNICAL FIELD

The present invention relates to a semiconductor device and a manufacturing method of a semiconductor device, and particularly relates to a heat dissipation structure for a power element.

BACKGROUND

Conventional control devices use heatsinks or spacers to dissipate heat of a high-heat-generation element, such as a power element. Patent Literature 1, for example, discloses a configuration in which spacers are disposed under elements to which a heatsink is attached. In Patent Literature 1, the configuration is such that the spacers are used in order to align the height of the heat dissipation surfaces of the elements and heat is dissipated only from the heatsink disposed on the top surface side of the elements.

Moreover, Patent Literature 2 discloses a device in which heat generation elements are secured to the printed board such that they are sandwiched between a base unit for cooling the heat generation elements and a holder from which the heatsink is configured.

PATENT LITERATURE

Patent Literature 1: Japanese Patent Application Laid-open No. 2004-95697
Patent Literature 2: Japanese Patent Application Laid-open No. 2011-199044

In Patent Literature 1 described above, however, heat is dissipated only from the heatsink secured to the top surface side of the elements. Moreover, in Patent Literature 2, heat is dissipated from the heatsink and the base unit, between which the power elements are sandwiched from above and below to secure the power elements. In the technologies disclosed in Patent Literature 1 and Patent Literature 2, heat is mainly dissipated from the heatsink secured to the top surface side of the power elements, and heat is not expected to be dissipated from the spacers or the base unit mounted on the board side, which is the bottom surface side of the power elements, or the base unit does not have a structure that can dissipate heat efficiently. Thus, in order to dissipate heat more efficiently, it has been necessary to increase the size of the fins of the heatsink on the top surface side. Moreover, a structure for supporting the enlarged heatsink is necessary. Furthermore, the heatsink vibrates because of the vibrations of the unit and thus a force is applied to the power elements, which may result in breaking the leads of the power elements or damaging the soldered portions.

SUMMARY

The present invention has been achieved in view of the above and an object of the present invention is to provide a semiconductor device that can improve the efficiency of dissipating heat from the bottom surface side of a semiconductor element and that can provide excellent heat dissipation characteristics without increasing the size of the heatsink on the top surface side.

In order to solve the above problems and achieve the object, a semiconductor device according to an aspect of the present invention includes a wiring board that includes a wiring layer including a wiring portion and a back-surface-side heat dissipation portion; a semiconductor element that is mounted on a first main surface of the wiring board and is connected to the wiring portion; a spacer that is interposed between the semiconductor element and the first main surface of the wiring board and is connected to the back-surface-side heat dissipation portion; and a heatsink that sandwiches, together with the spacer, the semiconductor element and is secured to the spacer. The wiring board includes an insulating board having the first main surface and a second main surface, which is on the opposite side of the first main surface, and the wiring layer including the wiring portion and the back-surface-side heat dissipation portion formed on the second main surface.

According to the present invention, an effect is obtained where it is possible to improve the efficiency of dissipating heat from the bottom surface side of a semiconductor element and provide excellent heat dissipation characteristics without increasing the size of the heatsink on the top surface side.

DETAILED DESCRIPTION

A semiconductor device and a manufacturing method of a semiconductor device according to embodiments of the present invention will be explained below in detail with reference to the drawings. This invention is not limited to the embodiments and can be modified as appropriate without departing from the scope of the present invention. In the drawings explained below, for ease of understanding, scales of respective layers or respective components may be shown differently from the actuality. The same holds true for the relations between the drawings. Hatching is not applied even to cross-sectional views in some cases in order to facilitate visualization of the drawings. Furthermore, hatching is applied even to plan views in some cases in order to facilitate visualization of the drawings.

First Embodiment

Figure 1:
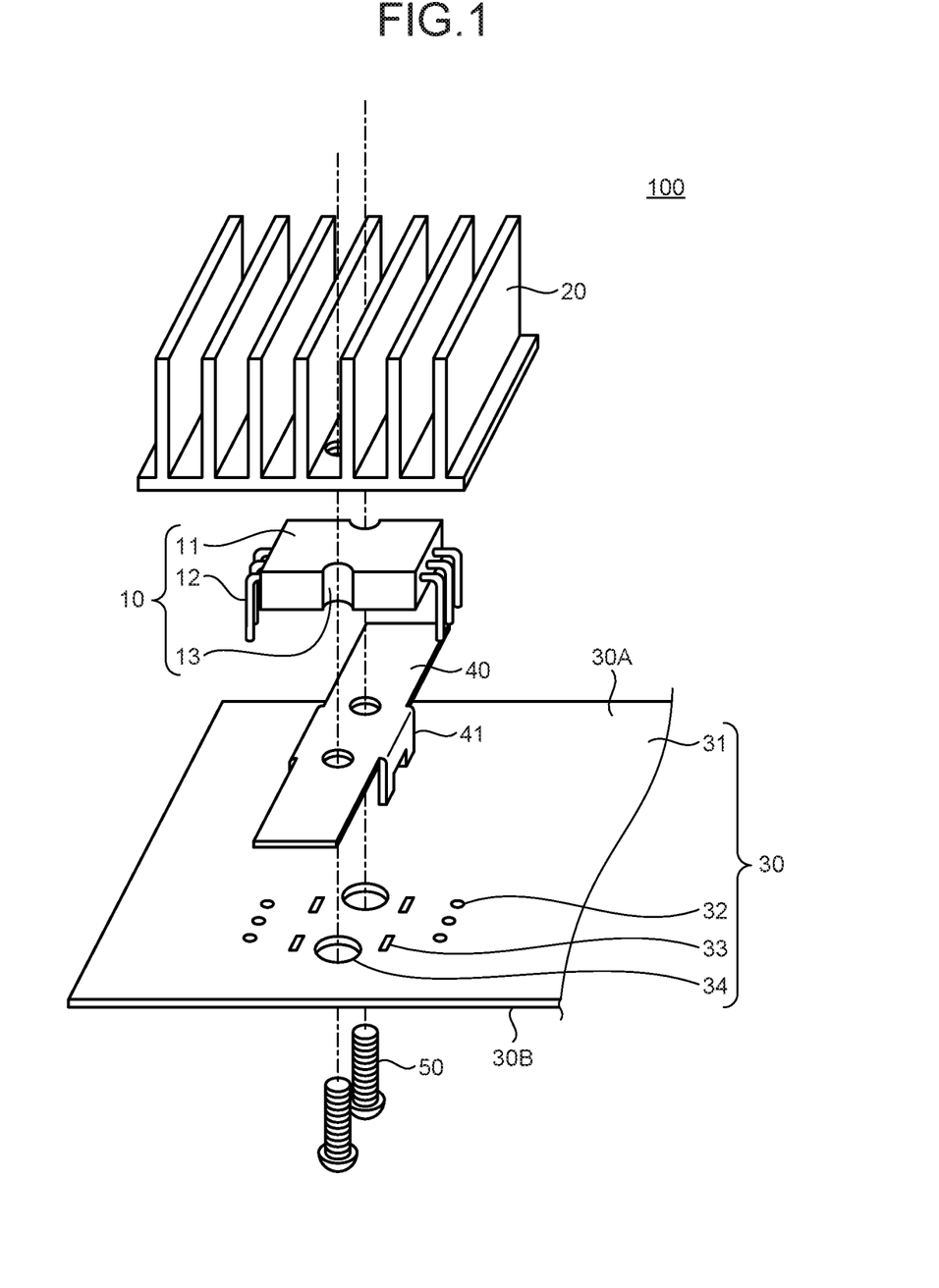
FIG. 1 is an exploded perspective view illustrating a semiconductor device according to a first embodiment.
Figure 2:
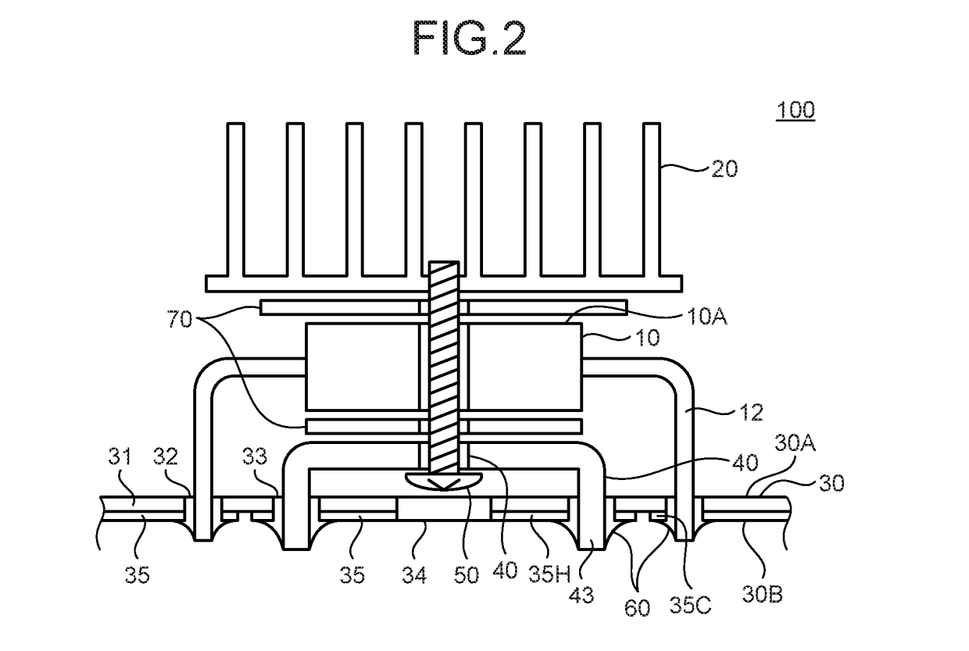
FIG. 2 is an explanatory cross-sectional view of the semiconductor device according to the first embodiment.
Figure 3:
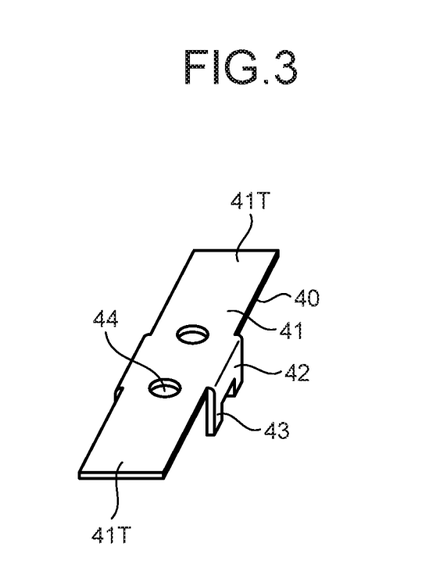
FIG. 3 is a perspective view illustrating a spacer of the semiconductor device according to the first embodiment.
Figure 4:
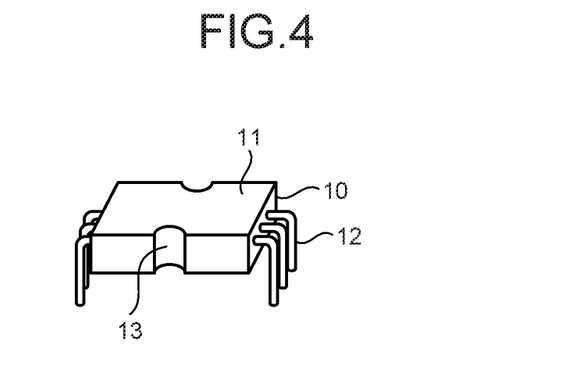
FIG. 4 is a perspective view illustrating a power element, the heat of which is dissipated from the semiconductor device according to the first embodiment.
Figure 5:
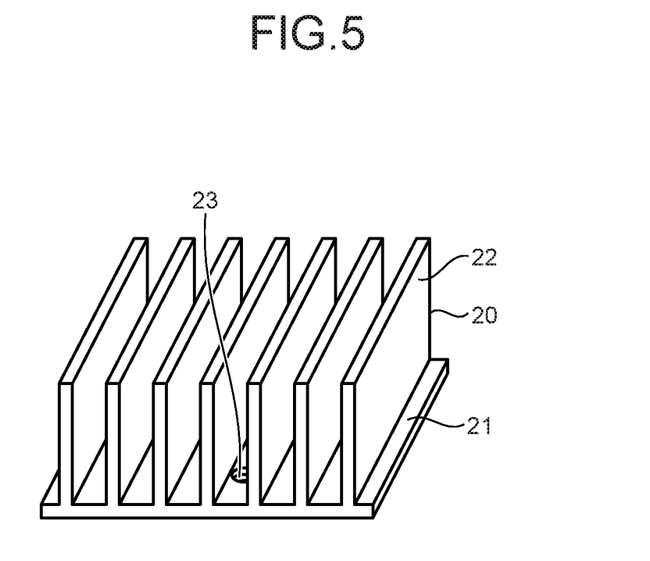
FIG. 5 is a perspective view illustrating a heatsink of the semiconductor device according to the first embodiment.
Figure 6:
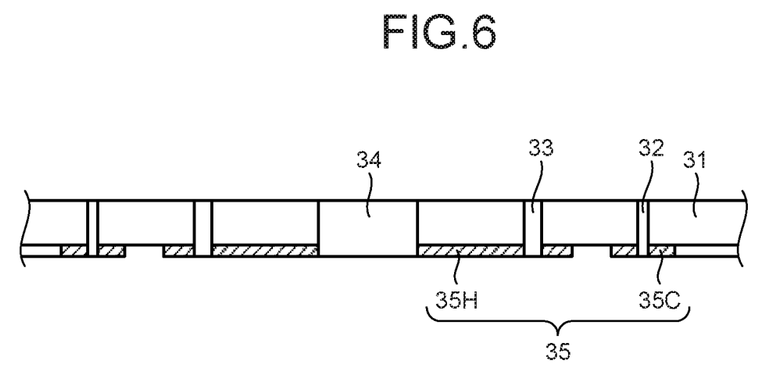
FIG. 6 is an explanatory cross-sectional view of a wiring board of the semiconductor device according to the first embodiment.

FIG. 1 is an exploded perspective view illustrating a control device, which is a semiconductor device according to a first embodiment; FIG. 2 is an explanatory cross-sectional view of the semiconductor device; FIG. 3 is a perspective view illustrating a spacer of the semiconductor device according to the first embodiment; FIG. 4 is a perspective view illustrating a power element, the heat of which is dissipated from the semiconductor device according to the first embodiment; FIG. 5 is a perspective view illustrating a heatsink of the semiconductor device according to the first embodiment; and FIG. 6 is an explanatory cross-sectional view of a wiring board of the semiconductor device according to the first embodiment. A control device 100 in the first embodiment is configured such that heat is dissipated from a spacer 40 provided under a power element 10 and heat is conducted from the spacer 40 to a heat dissipation portion 35H made of a wiring layer 35 provided on a back surface 30B side of a wiring board 30, which is a solder formed surface side, so as to enable the heat to be dissipated also from the pattern on the solder formed surface side of the wiring board 30. The back surface 30B of the wiring board 30 is the surface on the opposite side of an element mounting surface 30A on which the power element 10 is mounted.

As illustrated in FIG. 1, in the control device in the first embodiment, the power element 10 that generates heat is sandwiched between a heatsink 20 and the spacer 40 and is fastened with heatsink securing screws 50 so as to be secured under compression. With the heatsink 20, the power element 10 releases heat from the top surface side. The spacer 40 keeps the height from the bottom surface side of the power element 10 to the surface of the wiring board 30 constant. In this situation, the power element 10 to which the heatsink 20 and the spacer 40 are secured is mounted on the wiring board 30 and is secured with a solder layer 60. The wiring board 30 has power-element mounting holes 32 and spacer mounting holes 33 formed therein. Provision of screw holes 34 for allowing the heatsink securing screws 50 to pass therethrough enables the heatsink 20 to be secured with the heatsink securing screws 50 after the power element 10 and the spacer 40 are secured with the solder layer 60. In the control device 100, the heat dissipation device includes the heatsink 20, which dissipates the heat of the power element 10 to the top surface, and the spacer 40, which conducts the heat to the bottom surface. The control device 100, in particular, establishes a path for dissipating heat from the spacer 40.

As illustrated in FIG. 2 and FIG. 3, the spacer 40 is formed from a metal plate on which the solder layer 60 can be formed. For example, a copper plate plated with a nickel layer or gold can be used. The spacer 40 includes a spacer body 41 and vertical pieces 42, which are bent and stand vertical on both sides of the central portion of the spacer body 41. The height of the vertical pieces 42 is adjustable. Projections 43 are formed at the tips of the vertical pieces 42. The projections 43 are guided through the spacer mounting holes 33 in the wiring board 30 to the back surface 30B side and are secured, with the solder layer 60, to the heat dissipation portion 35H of the wiring layer 35 formed on the back surface 30B side. With the projections 43, the spacer 40 is positioned and secured on the wiring board 30 and releases the heat received from the power element 10 mounted on the element mounting surface 30A, which is the first main surface, to the heat dissipation portion 35H made of the copper-foil wiring layer 35 formed on the back surface 30B side of the wiring board 30, which is the second main surface side. Free ends 41T of the spacer body 41 may project to the lateral sides of the power element 10 so as to have a function of dissipating heat to the lateral sides. Mounting holes 44 are provided in the spacer body 41.

As illustrated in FIG. 4, the power element 10 includes an element body 11 made of a resin package in which a power semiconductor chip (not illustrated) is sealed and a plurality of lead terminals 12 led out from the element body 11. Notches 13 for positioning are formed on the surfaces orthogonal to the lead terminal lead-out surfaces. The heatsink securing screws 50 that pass through the heatsink 20 and the spacer 40 are brought into contact with the notches 13 from both sides; therefore, the power element 10 is sandwiched between the heatsink securing screws 50 so as to be secured.

As illustrated in FIG. 5, the heatsink 20 includes a heatsink body 21, which is brought into contact with the power element 10, and a plurality of fins 22, which extend from the heatsink body 21. The heatsink 20 has mounting holes 23 provided in the heatsink body 21. The heatsink securing screws 50 are screwed into the mounting holes 23.

As illustrated in FIG. 6, in the wiring board 30 on which the power element 10 and the heat dissipation device are mounted, the power-element mounting holes 32 and the spacer mounting holes 33 are formed in the element mounting region of an insulating board 31, such as an epoxy board. The pattern of the wiring layer 35 is formed on the back surface 30B side of the insulating board 31. The wiring layer 35 is formed by patterning a copper foil and the heat dissipation portion 35H made of a solid pattern is formed immediately below the power element 10. By forming a solder plated layer on the heat dissipation portion 35H as well as on a wiring portion 35C, which is a region for connecting the lead terminals 12 to the wiring layer 35, the heat dissipation performance is further improved. Provision of the screw holes 34 for allowing the heatsink securing screws 50 to pass therethrough enables the heatsink 20 to be secured with the heatsink securing screws 50 after the power element 10 and the spacer 40 are secured with the solder layer 60.

Next, the assembling method of the semiconductor device according to the first embodiment will be described. With this method, the wiring board 30 illustrated in FIG. 6 is first prepared and the spacer 40, the power element 10, which is a semiconductor element, and the heatsink 20 are stacked on the first main surface, which is the element mounting surface 30A of the wiring board 30, in the order they appear in this sentence.

The projections 43 of the spacer 40 are first inserted into the spacer mounting holes 33 in the wiring board 30. The tips of the projections 43 are bent inwardly if necessary onto the back surface 30B of the wiring board 30 so as to bring the projections 43 into contact with the heat dissipation portion 35H, and then the projections 43 are connected to the heat dissipation portion 35H with the solder layer 60.

Then, the lead terminals 12 of the power element 10 are inserted into the power-element-mounting holes 32 and are connected to the wiring layer 35, of which the wiring portion 35C formed on the back surface 30B is made, with the solder layer 60. Although the heat dissipation portion 35H and the region to which the lead terminals 12 are connected are electrically separated from each other, it is also possible to connect one of the lead terminals 12 to the heat dissipation portion 35H and use the heat dissipation portion 35H as part of the ground plate. The process of connecting the lead terminals 12 of the power element 10 to the wiring portion 35C with the solder layer 60 and the process of connecting the projections 43 of the spacer 40 to the heat dissipation portion 35H can be performed during the same thermal process by collectively heating solder after the solder is supplied. Alternatively, by covering in advance the heat dissipation portion 35H and the connection portions of the wiring layer 35 and the lead terminals 12 with a solder plated layer, solder connection can be performed by performing the thermal process without supplying solder.

Then, the heatsink 20 is mounted on a first main surface 10A side of the power element 10 and the spacer body 41 of the spacer 40 is thermally connected to the heat dissipation portion on the back surface side of the power element 10. For this connection, the heatsink securing screws 50 pass through the mounting holes 44 provided in the spacer body 41 of the spacer 40 from the screw holes 34 for allowing the heatsink securing screws 50 to pass therethrough, come into contact with the notches 13 of the power element 10, pass up to the mounting holes 23 provided in the heatsink body 21 of the heatsink 20, and are then screwed into the screw grooves formed on the mounting holes 23 in the heatsink 20 so as to be secured.

The power element 10 is sandwiched between the heatsink 20 and the spacer 40 and is secured with the heatsink securing screws 50. Thermally conductive sheets 70 are interposed between the respective contact surfaces so that the efficiency of conducting heat from the power element 10 to the heatsink 20 and the spacer 40 increases.

Thermally conductive grease may be injected instead of providing the thermally conductive sheets 70. Although screw grooves are formed on the mounting holes 23 in the heatsink 20, the heatsink securing screws 50 may be secured with nuts (not illustrated).

The spacer 40 is formed such that the free ends 41T of the spacer body 41 project to the lateral sides of the power element 10 so as to have a function of dissipating heat to the lateral sides. With this configuration, the area of contact with the air increases, thereby enabling the heat dissipation effect to be improved.

Because the heat conducted to the spacer 40 from the power element 10 is then conducted to the wiring layer 35 formed on the back surface 30B of the wiring board 30 via the solder layer 60, the heat dissipation effect can be improved by increasing the area of the heat dissipation portion 35H to which the heat is conducted and which is made of the wiring layer 35 of the wiring board 30.

As described above, according to the control device 100 in the first embodiment, heat can be efficiently conducted and dissipated from the spacer 40 to the heat dissipation portion 35H made of the wiring layer 35 formed on the back surface 30B of the wiring board 30; therefore, the heatsink 20 can be prevented from being increased in size. Therefore, it is possible to prevent an increase in the cost of the heatsink and addition of a structure for holding the enlarged heatsink.

As described above, with the control device 100 in the first embodiment, the heat dissipation portion 35H is provided on the wiring layer side, i.e., on the back surface 30B side of the wiring board 30, and heat can be dissipated also from the heat dissipation portion 35H; therefore, addition of a dedicated part for heat dissipation is not necessary and thus heat can be easily and efficiently dissipated. In addition to heat dissipation from the heatsink 20, a heat dissipation path is provided, which is for conducting heat of the power element 10 to the back surface 30B, which is on the opposite side of the element mounting surface 30A of the wiring board 30, and for dissipating the heat from the heat dissipation portion 35H. Therefore, heat can be efficiently dissipated from both sides of the power element 10. Furthermore, an effect is obtained where the heat dissipation efficiency of the control device can be improved without increasing the cost and thus the heatsink can be prevented from being increased in size.

In the first embodiment, a wiring layer is provided only on the back surface side of the wiring board, i.e., a single-sided pattern is applied; however, a wiring layer does not necessarily need to be provided only on one side and a double-sided pattern may be applied. Alternatively, a multilayer wiring board may be used. With the use of a multilayer wiring board, it is possible to, for example, form a heat dissipation path for conducting heat to the peripheral portion of the board by using an intermediate conductor. In the first embodiment, the lead terminals of the power element can be connected to the wiring layer on the element mounting surface side in accordance with where the wiring layer is provided. In other words, connection of the lead terminals to the wiring layer can be appropriately modified.

Second Embodiment

Figure 7:
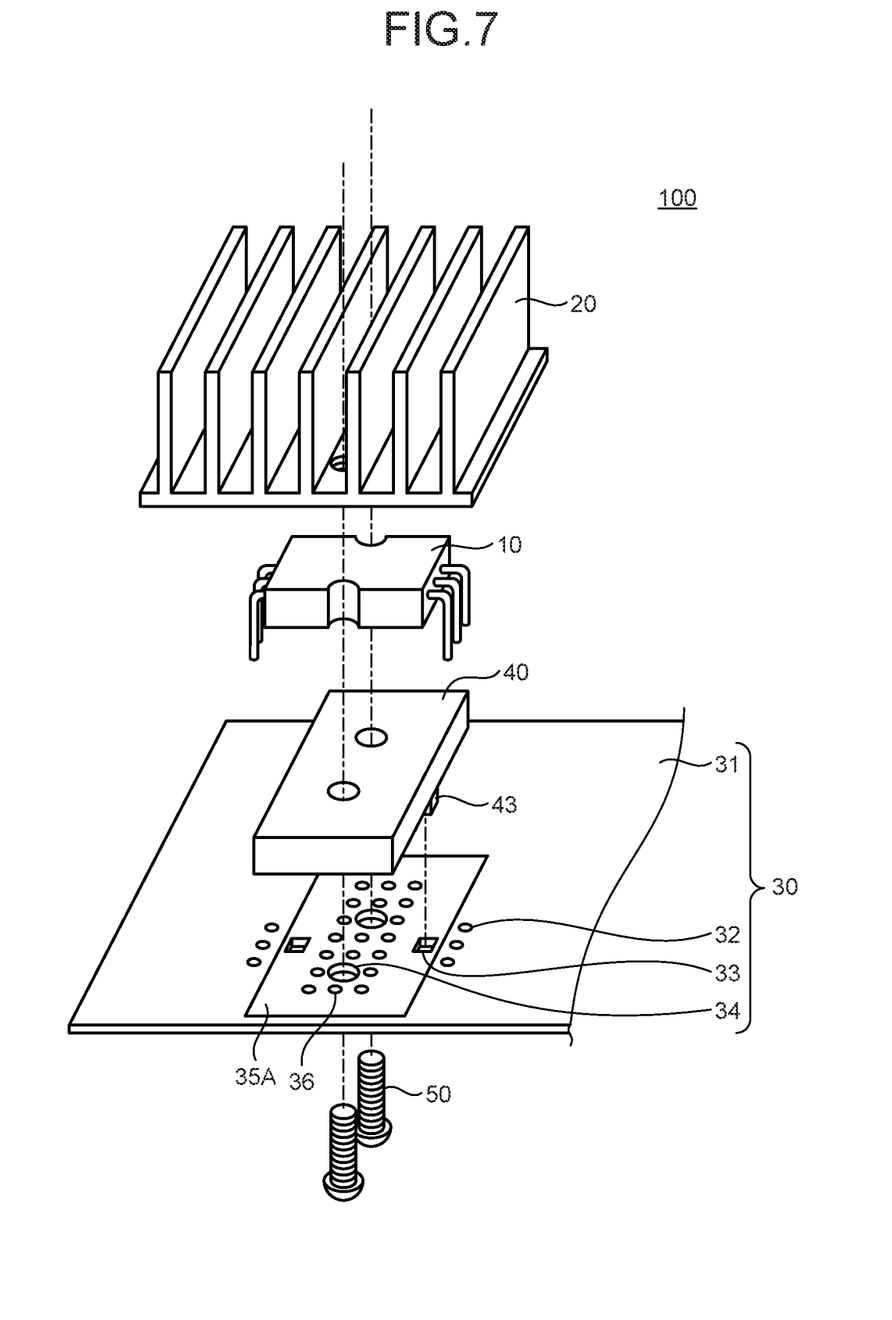
FIG. 7 is an exploded perspective view illustrating a semiconductor device according to a second embodiment.
Figure 8:
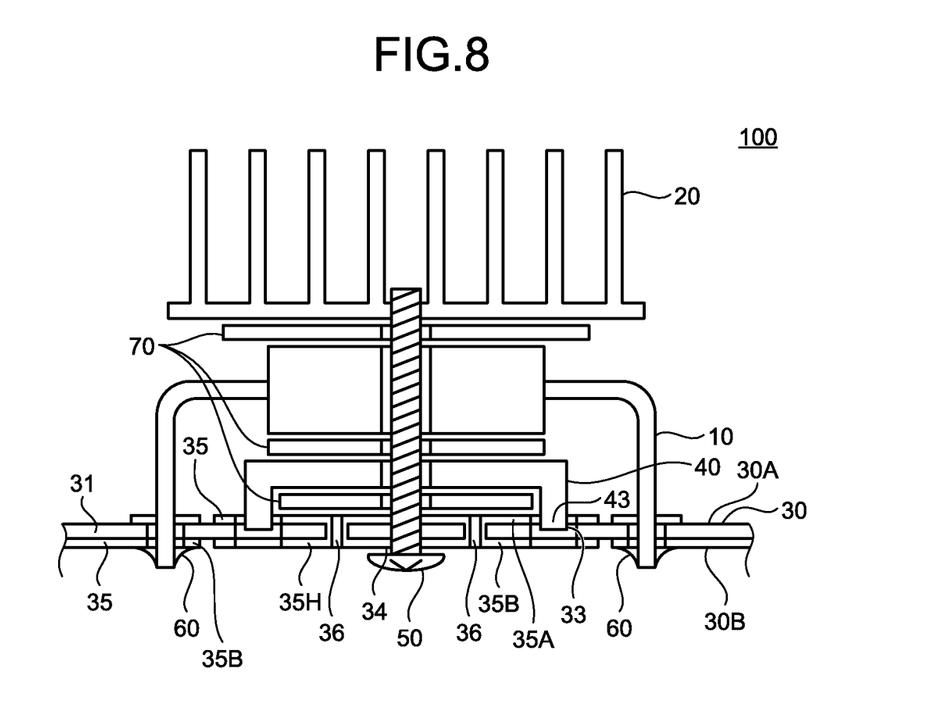
FIG. 8 is an explanatory cross-sectional view of the semiconductor device according to the second embodiment.

In the first embodiment, heat is conducted by connecting the spacer 40 and the pattern of the wiring layer 35 of the wiring board 30 with the solder layer 60. However, when the wiring layer 35 is formed on both sides of the wiring board 30, heat can be conducted without securing the spacer 40 and the wiring layer 35 of the wiring board 30 with the solder layer 60. FIG. 7 is an exploded perspective view illustrating the control device 100, which is a semiconductor device according to a second embodiment; FIG. 8 is an explanatory cross-sectional view of the semiconductor device; and FIG. 9 is an explanatory cross-sectional view of a wiring board of the semiconductor device according to the second embodiment.

Figure 9:
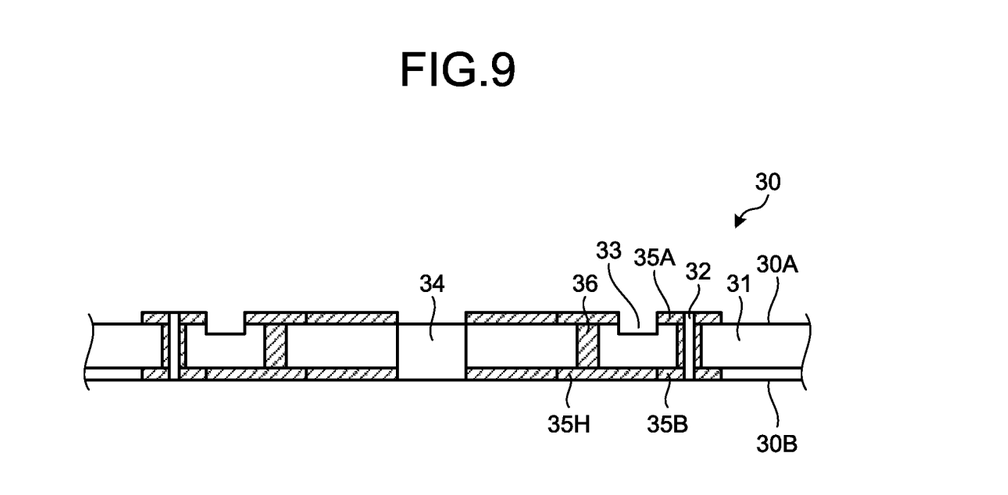
FIG. 9 is an explanatory cross-sectional view of a wiring board of the semiconductor device according to the second embodiment.

As illustrated in FIG. 9, the pattern of a wiring layer 35A, which comes into contact with the spacer 40, is provided on the element mounting surface 30A of the wiring board 30, on which the power element 10 is mounted. The wiring layer 35A is provided with a plurality of through holes 36, through which the wiring layer 35A on the element mounting surface 30A of the wiring board 30, on which the power element 10 is mounted, and a wiring layer 35B on the back surface 30B side communicate with each other, thereby enabling heat to be conducted. The spacer 40 is similar to that in the first embodiment; however, the spacer 40 includes the projections 43 for positioning and securing it on the wiring board 30. The wiring board 30 is provided with the screw holes 34 for allowing the heatsink securing screws 50 to pass therethrough. The spacer 40 is secured to the wiring board 30 without using the solder layer 60; therefore, it can be made of metal, such as aluminum, to which solder is not easily adhered.

After the control device 100 is assembled, as illustrated in the cross-sectional view in FIG. 8, the top surface of the spacer 40 is in contact with the power element 10 and the bottom surface of the spacer 40 is in contact with the wiring layer 35A of the wiring board 30. The wiring layer 35A of the wiring board 30, which is in contact with the spacer 40, and the wiring layer 35B of the wiring board 30, which is on the opposite side of the wiring layer 35A, communicate with each other through the through holes 36; therefore, heat can be conducted from the spacer 40 side to the surface on the opposite side.

The assembling method is similar to the assembling method of the control device 100 according to the first embodiment; however, in the control device 100 according to the second embodiment, the spacer 40 is brought into contact with the front-surface-side heat dissipation portion made of the wiring layer 35A on the element mounting surface 30A side of the wiring board 30. In order to efficiently conduct heat between the spacer 40 and the wiring board 30, the power element 10 and the spacer 40 are sandwiched between the heatsink 20 and the wiring board 30 and are secured with the heatsink securing screws 50. In the control device 100 according to the second embodiment also, the thermally conductive sheets 70 are interposed between the respective contact surfaces so that the efficiency of conducting heat from the power element 10 to the heatsink 20 and the spacer 40 increases.

According to the control device 100 in the second embodiment, compared with the first embodiment, the heat dissipation path increases, which is for receiving heat from the spacer 40 by the front-surface-side heat dissipation portion made of the wiring layer 35A on the element mounting surface 30A side of the wiring board 30 and for conducting the heat to the heat dissipation portion 35H on the back surface 30B side via the through holes 36. Therefore, an effect is obtained where the heat dissipation performance is further improved compared with the control device 100 in the first embodiment.

Thermally conductive grease may be injected instead of providing the thermally conductive sheets 70. In the control device 100 in the second embodiment also, although screw grooves are formed on the mounting holes 23 in the heatsink 20, the heatsink securing screws 50 may be secured with nuts (not illustrated).

The spacer 40 may pass through the wiring board 30 or may be secured on the element mounting surface 30A side. The spacer 40 can be secured by using an adhesive having excellent thermal conductivity, by crimping, or by using other methods. However, when the spacer 40 is secured on the element mounting surface 30A side, it is desirable to secure the spacer 40 with an adhesive.

In the second embodiment, the wiring layer 35 of the wiring board 30 is formed with a double-sided pattern provided on both sides, i.e., the element mounting surface 30A side and the back surface 30B side. However, a wiring layer does not necessarily need to be provided on both sides and a single-sided pattern may be applied. It is satisfactory if the spacer 40 is thermally in contact with at least any of the front-surface-side heat dissipation portion made of the wiring layer 35A and the back-surface-side heat dissipation portion made of the wiring layer 35B. It is satisfactory if thermal connection between the heat dissipation portions on both sides is realized via the through holes 36 for forming the heat dissipation path and the heat from the spacer 40 is conducted to the back surface 30B side of the wiring board 30. Alternatively, a multilayer wiring board may be used. In the present embodiment also, with the use of a multilayer wiring board, it is possible to, for example, form a heat dissipation path for conducting heat to the peripheral portion of the board by using an intermediate conductor. The lead terminals 12 of the power element 10 can be connected to the wiring layer 35 on the element mounting surface 30A side.

In the first and second embodiments, two heatsink securing screws 50 are provided and they are caused to match the notches 13 provided on both sides of the element body 11 of the power element 10 so as to secure it while being positioned. However, the structure is not limited thereto. For example, one through hole may be formed in the center of the element body 11 and the heatsink securing screw 50 may be inserted through this through hole so as to be secured. With this structure, assembling is facilitated.

Some embodiments of the present invention have been described. However, these embodiments are presented as examples and are not intended to limit the scope of the invention. These novel embodiments can be implemented in other various forms, and various omissions, replacements, and changes can be made without departing from the spirit of the present invention. These embodiments and their modifications are included in the scope of the invention and are also included in the invention described in the claims and its equivalents.

The invention claimed is:

1. A semiconductor device comprising:
a wiring board that includes an insulating board and a wiring layer, the insulating board having a first main surface and a second main surface, which is on an opposite side of the first main surface, the wiring layer being formed on the second main surface of the insulating board and including a wiring portion and a back-surface-side heat dissipation portion;
a semiconductor element that is mounted on the first main surface of the wiring board and is connected to the wiring portion;
a spacer that is interposed between the semiconductor element and the first main surface of the wiring board and that is connected to the back-surface-side heat dissipation portion of the wiring layer formed on the second main surface of the insulating board; and
a heatsink that sandwiches, together with the spacer, the semiconductor element and is secured to the spacer, wherein
the spacer includes a projection that passes through the wiring board and projects to the second main surface side,
the projection is connected to the back-surface-side heat dissipation portion,
the wiring layer includes a front-surface-side heat dissipation portion that is electrically separated from a wiring portion that is electrically connected to the semiconductor element, and
the spacer contacts the front-surface-side heat dissipation portion.

2. The semiconductor device according to claim 1, wherein the back-surface-side heat dissipation portion and the front-surface-side heat dissipation portion are connected to each other via a through hole formed in the wiring board.

3. The semiconductor device according to claim 1, wherein the spacer is secured with a penetration screw that sandwiches the semiconductor element and passes up to the heatsink.

4. The semiconductor device according to claim 1, wherein
the spacer includes
a spacer body that is in contact with a back surface of the semiconductor element and has a pair of positioning holes provided at positions surrounding two opposite side surfaces of the semiconductor element, and
a vertical piece that stands vertical from the spacer body to the wiring board side, and
a tip of the vertical piece projects to the second main surface side to form the projection.

5. The semiconductor device according to claim 4, wherein the spacer and the heatsink are secured with a pair of penetration screws that sandwich the semiconductor element and pass through the pair of positioning holes to the heatsink.

6. The semiconductor device according to claim 4, wherein the spacer and the heatsink are secured with a pair of penetration screws that sandwich the semiconductor element, pass, from the second main surface side of the wiring board, up to the heatsink through the wiring board and the pair of positioning holes in the spacer.

7. The semiconductor device according to claim 4, wherein
the semiconductor element includes
a lead terminal that is led out from lead-terminal lead-out surfaces that are on opposite sides, and
a recess in a region corresponding to the positioning holes on two opposite side surfaces excluding the lead-terminal lead-out surfaces, and
the penetration screw is in contact with the recess.

8. A semiconductor device comprising:
a wiring board that includes an insulating board and a wiring layer, the insulating board having a first main surface and a second main surface, which is on an opposite side of the first main surface, the wiring layer being formed on the second main surface of the insulating board and including a wiring portion and a back-surface-side heat dissipation portion;
a semiconductor element that is mounted on the first main surface of the wiring board and is connected to the wiring portion;
a spacer that is interposed between the semiconductor element and the first main surface of the wiring board and that is connected to the back-surface-side heat dissipation portion of the wiring layer formed on the second main surface of the insulating board; and
a heatsink that sandwiches, together with the spacer, the semiconductor element and is secured to the spacer, wherein
the wiring layer includes a front-surface-side heat dissipation portion that is electrically separated from a wiring portion that is electrically connected to the semiconductor element,
the spacer contacts the front-surface-side heat dissipation portion, and
the back-surface-side heat dissipation portion and the front-surface-side heat dissipation portion are connected to each other via a through hole formed in the wiring board.

9. A semiconductor device comprising:
a wiring board that includes an insulating board and a wiring layer, the insulating board having a first main surface and a second main surface, which is on an opposite side of the first main surface, the wiring layer being formed on the second main surface of the insulating board and including a wiring portion and a back-surface-side heat dissipation portion;
a semiconductor element that is mounted on the first main surface of the wiring board and is connected to the wiring portion;
a spacer that is interposed between the semiconductor element and the first main surface of the wiring board and that is connected to the back-surface-side heat dissipation portion of the wiring layer formed on the second main surface of the insulating board; and
a heatsink that sandwiches, together with the spacer, the semiconductor element and is secured to the spacer, wherein
the spacer is secured with a penetration screw that sandwiches the semiconductor element and passes up to the heatsink, and
the semiconductor element includes
a lead terminal that is led out from lead-terminal lead-out surfaces that are on opposite sides, and
a recess in a region corresponding to positioning holes provided in the spacer on two opposite side surfaces excluding the lead-terminal lead-out surfaces, and
the penetration screw is in contact with the recess.

* * * * *